(12) United States Patent
Jai et al.

(10) Patent No.: US 11,527,492 B2
(45) Date of Patent: Dec. 13, 2022

(54) DISPLAY PANEL WITH PLANARIZATION LAYER AND SIDEWALLS

(71) Applicant: AU Optronics (Kunshan) Co., Ltd., Kunshan (CN)

(72) Inventors: Pang-Ho Jai, Kunshan (CN); Wen-Chieh Chou, Kunshan (CN); Shu-Ting Chang, Kunshan (CN)

(73) Assignee: AU OPTRONICS (KUNSHAN) CO., LTD., Kunshan (CN)

( * ) Notice: Subject to any disclaimer, the term of this patent is extended or adjusted under 35 U.S.C. 154(b) by 0 days.

(21) Appl. No.: 17/274,264

(22) PCT Filed: Jun. 4, 2019

(86) PCT No.: PCT/CN2019/090000
§ 371 (c)(1),
(2) Date: Mar. 8, 2021

(87) PCT Pub. No.: WO2020/228077
PCT Pub. Date: Nov. 19, 2020

(65) Prior Publication Data
US 2021/0351138 A1    Nov. 11, 2021

(30) Foreign Application Priority Data
May 13, 2019   (CN) .......................... 201910400293.5

(51) Int. Cl.
*H01L 23/29* (2006.01)
*H01L 23/00* (2006.01)
*H01L 23/31* (2006.01)

(52) U.S. Cl.
CPC .......... *H01L 23/564* (2013.01); *H01L 23/293* (2013.01); *H01L 23/3171* (2013.01)

(58) Field of Classification Search
CPC combination set(s) only.
See application file for complete search history.

(56) References Cited

U.S. PATENT DOCUMENTS

2017/0033312 A1    2/2017   Kim et al.

FOREIGN PATENT DOCUMENTS

| CN | 106940495 A | 7/2017 |
|---|---|---|
| CN | 108091675 A | 5/2018 |

(Continued)

*Primary Examiner* — Suberr L Chi
(74) *Attorney, Agent, or Firm* — WPAT, PC

(57) ABSTRACT

The invention discloses a display panel, comprising: a first substrate including a display region and a peripheral region adjacent to each other; a plurality of pixel units disposed on the first substrate and located in the display region; a planarization layer disposed on the first substrate and located in the display region and the peripheral region; and an organic passivation layer disposed on the first substrate, covering the planarization layer and located in the display region and the peripheral region; wherein the planarization layer further comprises a first region planarization layer located in the display region, and a second region planarization layer located in the peripheral region, the first region planarization layer is formed with a first sidewall in a boundary region between the display region and the peripheral region, and a height of the first sidewall is greater than a height of the first region planarization layer. The invention can effectively reduce probability of the organic passivation layer on sidewalls of the passivation layers, and can better avoid moisture from penetrating the organic material into the display panel.

14 Claims, 5 Drawing Sheets

(56) References Cited

FOREIGN PATENT DOCUMENTS

| | | |
|---|---|---|
| CN | 108281458 A | 7/2018 |
| CN | 107180923 B | 9/2018 |
| CN | 108538899 A | 9/2018 |
| CN | 109166902 A | 1/2019 |

DISPLAY PANEL WITH PLANARIZATION LAYER AND SIDEWALLS

BACKGROUND OF THE INVENTION

1. Field of the Invention

The invention relates to a display panel, and particularly to a display panel capable of avoiding penetration of moisture.

2. Related Art

With development of science and technology, display devices are widely applied to many electronic products, such as, mobile phones, tablet computers, watches, and the like. To improve display quality, the display device with a large size, a high resolution and a high brightness is developed as required.

As service time increases, moisture will easily penetrated into an interior of the display device through an organic material layer, causing defects of peeling of the organic material layer and oxidization of electrodes & TFT devices inside the display device, and bad effect on the display device. FIG. 1 is a structural diagram of a display panel in the prior art. As shown in FIG. 1, the display panel 100 comprises a display region AA and a peripheral region BA, and a planarization layer 102 and an organic passivation layer 103 sequentially formed on a substrate 101. In the prior art, the planarization layer 102 is a discontinuity structure by disconnecting the planarization layer 102 in the peripheral region BA, thereby avoiding moisture from penetrating into the display region AA. However, the organic passivation layer 103 is still formed on a sidewall of the planarization layer 102. In other words, an outer edge of the planarization layer 102 in the display region AA of the display panel 100 is covered with the organic passivation layer 103, such that moisture easily penetrates the organic passivation layer 103 into the display region AA.

Therefore, the key to solve the problem is to find out how to reduce probability of the organic passivation layer on sidewalls of the passivation layers, and better preventing penetration of moisture.

SUMMARY OF THE INVENTION

A display panel in one embodiment of the invention comprises a first substrate including a display region and a peripheral region adjacent to each other; a plurality of pixel units disposed on the first substrate and located in the display region; a planarization layer disposed on the first substrate and located in the display region and the peripheral region; and an organic passivation layer disposed on the first substrate, covering the planarization layer and located in the display region and the peripheral region; wherein the planarization layer further comprises a first region planarization layer located in the display region, and a second region planarization layer located in the peripheral region, the first region planarization layer is formed with a first sidewall in a boundary region between the display region and the peripheral region, and a height of the first sidewall is greater than a height of the first region planarization layer.

In the display panel, the second region planarization layer is formed with a second sidewall on an edge facing the display region, and a height of the second sidewall is greater than a height of the second region planarization layer.

In the display panel, the height of the second sidewall is the same as the height of the first sidewall.

In the display panel, the planarization layer further comprises a third region planarization layer located between the first region planarization layer and the second region planarization layer, and separated from the first region planarization layer and the second region planarization layer, and a third sidewall and/or a fourth sidewall are formed on edges of both sides of the third region planarization layer.

In the display panel, a height of the third sidewall and/or the fourth sidewall is the same as the height of the first sidewall.

In the display panel, the planarization layer further comprises a third region planarization layer, and a height of the third region planarization layer is the same as the height of the first sidewall.

In the display panel, the planarization layer further comprises a third region planarization layer, and a height of the third region planarization layer is the same as the height of the first sidewall and/or the second sidewall.

In the display panel, the third region planarization layer has a first sidewall and a second sidewall, a tilt angle θ1 is formed between the first sidewall and the first substrate, a tilt angle θ2 is formed between the second sidewall and the first substrate, and the tilt angle θ1 and/or the tilt angle θ2 are 60°≤θ1≤90° and 60°≤θ2≤90°.

In the display panel, a tilt angle θ3 is formed between the first sidewall and the first substrate, a tilt angle θ4 is formed between the second sidewall and the first substrate, and the tilt angle θ3 and/or the tilt angle θ4 are 60°≤θ3≤90° and 60°≤θ4≤90°.

In the display panel, a distance between the first region planarization layer and the third region planarization layer is greater than 10 μm.

In the display panel, a height difference ΔH is formed between the second sidewall and the second region planarization layer, where 0.5 μm≤ΔH≤1 μm.

In the display panel, the planarization layer further comprises a third region planarization layer having a width greater than 10 μm.

In the display panel, a height of the third region planarization layer is between 2.5 μm and 3 μm.

A display panel in another embodiment of the invention comprises a first substrate including a display region and a peripheral region adjacent to each other; a plurality of pixel units disposed on the first substrate and located in the display region; a planarization layer disposed on the first substrate and located in the display region and the peripheral region; and an organic passivation layer disposed on the first substrate, covering the planarization layer and located in the display region and the peripheral region; wherein the planarization layer further comprises a first region planarization layer located in the display region, and a second region planarization layer located in the peripheral region; wherein the first region planarization layer has a convex structure adjacent to the peripheral region.

In the display panel, the convex structure is located on a lateral side of the first region planarization layer, and the lateral side faces the second region planarization layer.

Hereinafter the invention is described in details with reference to the accompanying drawings and the detailed embodiments, but the invention is not limited thereto.

PREFERABLE EMBODIMENTS OF THE INVENTION

Figure 1:
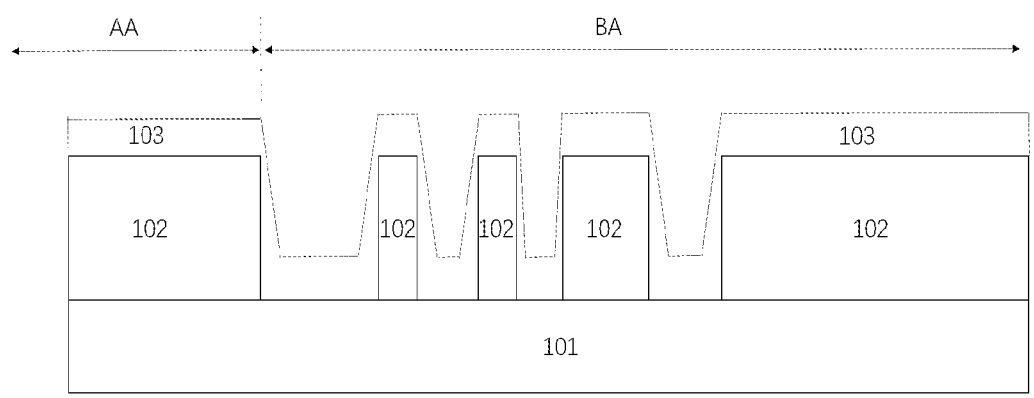
FIG. 1 is a structural diagram of a display panel in the prior art.
Figure 2:
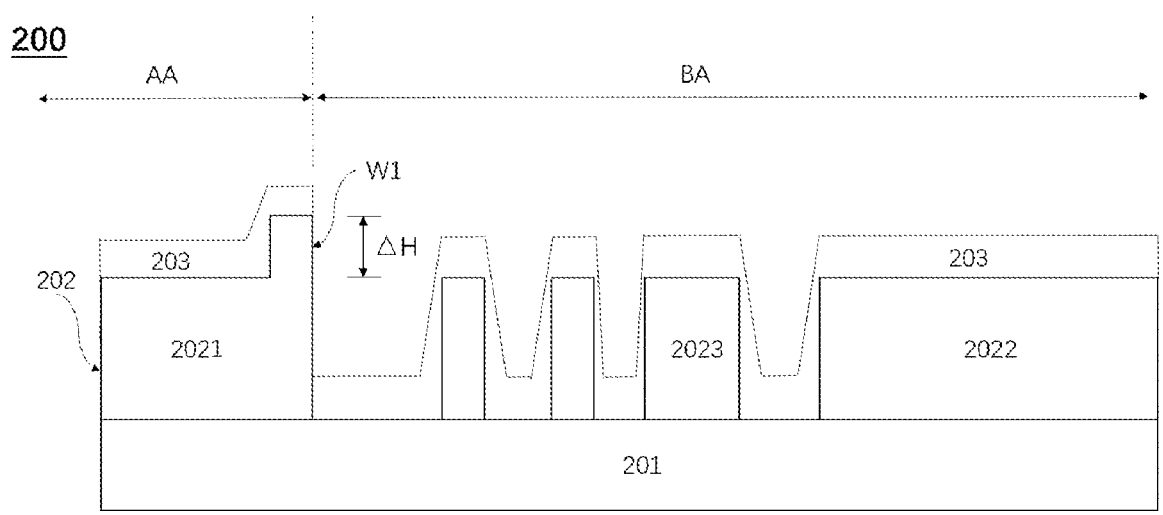
FIG. 2 is a structural diagram of a display panel in one embodiment of the invention.

Hereinafter structure principle and working principle of the invention are described in details with reference to the accompanying drawings:

FIG. 2 is a structural diagram of a display panel in one embodiment of the invention. As shown in FIG. 2, the display panel 200 comprises a substrate 201 including a display region AA and a peripheral region BA adjacent to each other. Moreover, the peripheral region BA surrounds the display region AA, the display region AA is formed with a plurality of pixel units (not shown), and the peripheral region BA is formed with a driving circuit for driving the pixel units and a control circuit (not shown). In this embodiment, a planarization layer 202 is formed on the substrate 201, and an organic passivation layer 203 is formed on the planarization layer 202 and covers the planarization layer 202. The planarization layer 202 and the organic passivation layer 203 are formed in both the display region AA and the peripheral region BA, and the planarization layer 202 formed in the peripheral region BA is discontinuity. In this embodiment, the planarization layer 202 comprises a planarization layer 2021 formed in the display region AA, and a planarization layer 2022 and a planarization layer 2023 formed in the peripheral region BA. The planarization layer 2023 is formed between the planarization layer 2021 and the planarization layer 2022, and the planarization layer 2021, the planarization layer 2022 and the planarization layer 2023 are separated from each other. In a boundary region between the display region AA and the peripheral region BA, the planarization layer 2021 is formed with a sidewall W1, a height of the sidewall W1 is greater than a height of the planarization layer 2021, and a height difference $\Delta H$ is formed between the sidewall W1 and the planarization layer 2021, where an optimal numerical range of $\Delta H$ is $0.5\ \mu m \leq \Delta H \leq 1\ \mu m$. In other words, the sidewall W1 may be viewed as a convex structure of the planarization layer 2021, and is adjacent to the peripheral region BA. Since the planarization layer 2021 is formed with the sidewall W1, and the height difference is produced between the sidewall W1 and the planarization layer 2021, the organic passivation layer 203 naturally falls off along the sidewall W1 or the sidewall of the planarization layer 2021 after the organic passivation layer 203 is coated. Therefore, the effect of not forming the organic passivation layer 203 on the sidewall W1 or the sidewall of the planarization layer 2021 is produced, and moisture can be avoided from penetrating the organic passivation layer 203 into the display region AA.

In this embodiment, a width of the planarization layer 2023, such as, is greater than 10 μm, and a height, such as, is between 2.5 μm and 3 μm.

Figure 3:
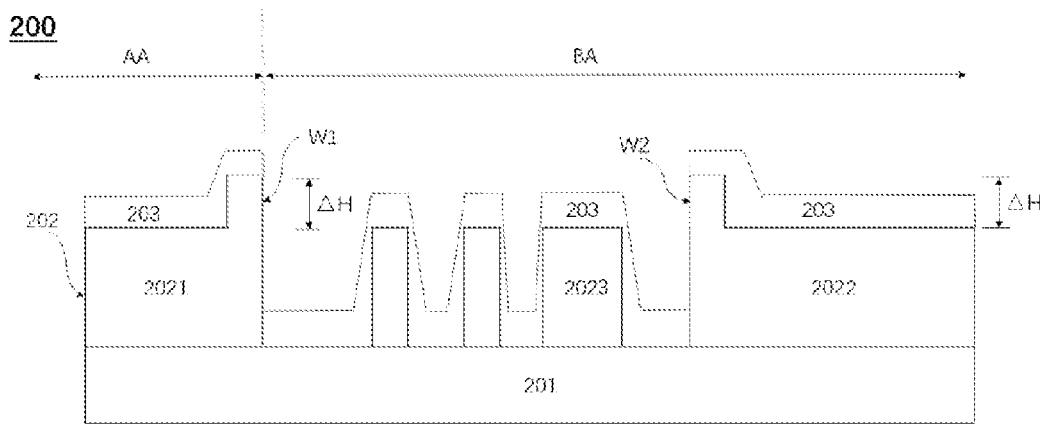
FIG. 3 is a structural diagram of a display panel in another embodiment of the invention.

FIG. 3 is a structural diagram of a display panel in another embodiment of the invention. As shown in FIGS. 2 and 3, difference from the embodiment of FIG. 2 is the display panel 200 in the embodiment of FIG. 3. The planarization layer 2022 formed in the peripheral region BA is formed with a sidewall W2 on an edge of one side facing the display region AA, and a height of the sidewall W2 is greater than a height of the planarization layer 2022. Heights of the sidewall W1 and the sidewall W2 can be the same, and also can be different. This embodiment takes an example where the heights of the sidewall W1 and the sidewall W2 are the same, but the invention is not limited thereto. Therefore, a height difference $\Delta H$ is also formed between the sidewall W2 and the planarization layer 2022, where an optimal numerical range of $\Delta H$ is $0.5\ \mu m \leq \Delta H \leq 1\ \mu m$.

Figure 4:
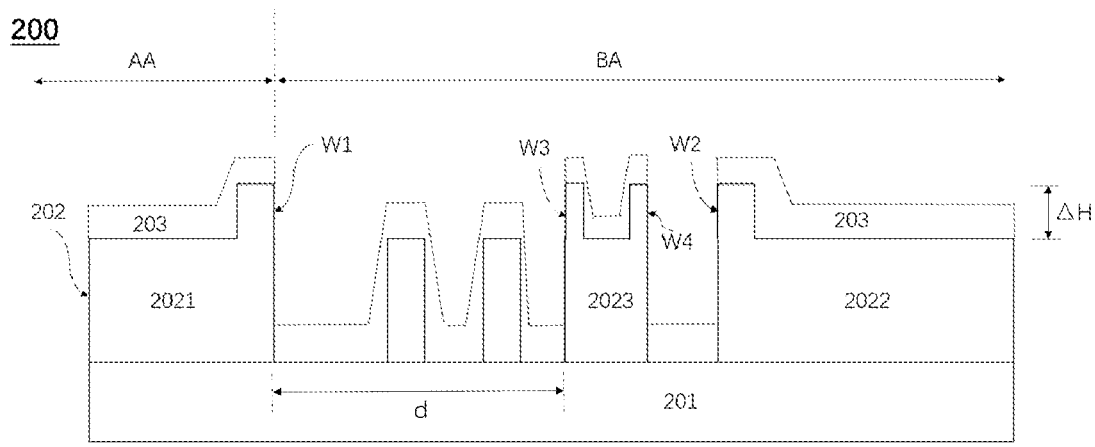
FIG. 4 is a structural diagram of a display panel in still another embodiment of the invention.

FIG. 4 is a structural diagram of a display panel in still another embodiment of the invention. As shown in FIGS. 3 and 4, difference from the embodiment of FIG. 3 is the display panel 200 in the embodiment of FIG. 4. The planarization layer 2023 formed in the peripheral region BA is formed with a sidewall W3 on an edge of one side facing the display region AA, and a sidewall W4 on an edge of one side far away from the display region AA. In this embodiment, taking the sidewall W3 and the sidewall W4 simultaneously formed at both sides of the planarization layer 2023 for example, it is also possible that the sidewall W3 or the sidewall W4 is formed at only one side of the planarization layer 2023. A height of the sidewall W3 or W4 is greater than a height of the planarization layer 2023, and heights of the sidewall W3 or W4 and the sidewall W1 or W2 can be the same, and also can be different. This embodiment takes an example where the heights of the sidewalls W1, W2, W3 and W4 are the same, but the invention is not limited thereto. Therefore, a height difference $\Delta H$ is also formed between the sidewalls W3, W4 and the planarization layer 2023, where an optimal numerical range of $\Delta H$ is $0.5\ \mu m \leq \Delta H \leq 1\ \mu m$.

As a variation example, in the embodiment of FIG. 4, it is also possible that only the sidewall W1 is formed in the planarization layer 2021, and the sidewalls W3, W4 are formed in the planarization layer 2023, but the sidewall is not formed in the planarization layer 2022. In this variation example, a distance d is formed between the planarization layer 2023 and the sidewall W1, where the distance d is greater than 10 μm. Since the sidewall W1 is formed in the planarization layer 2021, and the sidewalls W3, W4 are formed in the planarization layer 2023, the height differences between the sidewalls W1, W3, W4 and the planarization layer 2021 or 2023 are produced, the distance d is formed between the planarization layer 2023 and the sidewall W1, and the organic passivation layer 203 naturally falls off along the sidewalls W1, W3, W4 or the sidewall of the planarization layer 2021 or 2023 after the organic passivation layer 203 is coated. Therefore, the effect of not forming the organic passivation layer 203 on the sidewalls W1, W3, W4 or the sidewall of the planarization layer 2021 or 2023 is produced, and moisture can be avoided from penetrating the organic passivation layer 203 into the display region AA.

Figure 5:
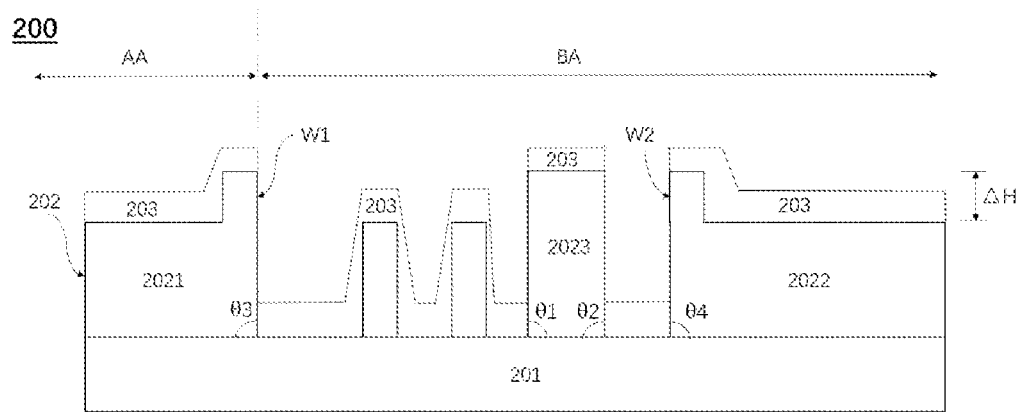
FIG. 5 is a structural diagram of a display panel in even another embodiment of the invention.

FIG. 5 is a structural diagram of a display panel in even another embodiment of the invention. As shown in FIGS. 4 and 5, difference from the embodiment of FIG. 4 is the display panel 200 in the embodiment of FIG. 5. The planarization layer 2023 formed in the peripheral region BA is higher than the planarization layer 2021 formed in the display region AA and the planarization layer 2022 formed in the display region BA, and heights of the planarization layer 2023 and the sidewall W1 or W2 can be the same, and also can be different. This embodiment takes an example where the heights of the planarization layer 2023 and the sidewalls W1, W2 are the same, but the invention is not limited thereto. Therefore, a height difference $\Delta H$ is also formed between the planarization layer 2023, the sidewalls W1, W2 and the planarization layer 2021 or 2022, where an optimal numerical range of ΔH is 0.5 μm≤ΔH≤1 μm.

Specifically, as shown in FIG. 5, an angle θ1 is formed between the sidewall of the planarization layer 2023 facing the display region AA and the substrate 201, an angle θ2 is formed between the sidewall far away from the display region AA and the substrate 201, an angle θ3 is formed between the sidewall W1 and the substrate 201, and an angle θ4 is formed between the sidewall W2 and the substrate 201, where 60°≤θ1≤90°, 60°≤θ2≤90°, 60°≤θ3≤90° and 60°≤θ4≤90°. Since the sidewall W1 is formed in the planarization layer 2021, the sidewall W2 is formed in the planarization layer 2022, and the sidewalls W3 and W4 are formed in the planarization layer 2023, the height differences are produced between the sidewalls W1, W2, W3, W4 and the planarization layer 2021, 2022 or 2023, and due to existence of the angles θ1, θ2, θ3 and θ4, the organic passivation layer 203 naturally falls off along the sidewalls W1, W2, W3, W4 or the sidewall of the planarization layer 2021, 2022 or 2023 after the organic passivation layer 203 is coated. Therefore, the organic passivation layer 203 formed on the sidewalls W1, W2, W3, W4 or the sidewall of the planarization layer 2021, 2022 or 2023 and the organic passivation layer 203 formed on top surfaces of the planarization layers 2021, 2022, 2023 are disconnected, such that moisture can be avoided from penetrating the organic passivation layer 203 into the display region AA.

As a variation example, in the embodiment of FIG. 5, it is also possible that only the sidewall W1 is formed in the planarization layer 2021, and the heights of the planarization layer 2023 and the sidewall W1 are the same, but the sidewall W2 is not formed in the planarization layer 2022.

To sum up, in the embodiments of the invention, height differences between the sidewalls and the planarization layers are produced using the way of forming sidewalls in the planarization layer, and the organic passivation layer naturally falls off after being coated, thereby achieving the effect of disconnecting the organic passivation layer, i.e., not forming the organic passivation layer on the sidewalls of the passivation layers. Of course, the forming number and the positions of sidewalls can be selected according to requirements for production process and products.

Of course, the invention also may have various other embodiments, and those skilled in the art shall make various corresponding changes and variations without departing from spirit and essence of the invention, but these corresponding changes and variations shall belong to the scope protected by the appended claims of the invention.

INDUSTRIAL PRACTICABILITY

Application of the display panel of the invention has the following advantageous effects:

can reduce probability of the organic passivation layer on sidewalls of the passivation layers, and better prevent penetration of moisture.

What is claimed is:

1. A display panel, comprising:
a first substrate including a display region and a peripheral region adjacent to each other;
a plurality of pixel units disposed on the first substrate and located in the display region;
a planarization layer disposed on the first substrate and located in the display region and the peripheral region; and
an organic passivation layer disposed on the first substrate, covering the planarization layer and located in the display region and the peripheral region;
wherein the planarization layer further comprises a first region planarization layer located in the display region, and a second region planarization layer located in the peripheral region, the first region planarization layer is formed with a first sidewall in a boundary region between the display region and the peripheral region, and a height of the first sidewall is greater than a height of the first region planarization layer;
the planarization layer further comprises a third region planarization layer, and a height of the third region planarization layer is the same as the height of the first sidewall.

2. The display panel according to claim 1, wherein the second region planarization layer is formed with a second sidewall on an edge facing the display region, and a height of the second sidewall is greater than a height of the second region planarization layer.

3. The display panel according to claim 2, wherein the height of the second sidewall is the same as the height of the first sidewall.

4. The display panel according to claim 2, wherein a height of the third region planarization layer is the same as the height of the second sidewall.

5. The display panel according to claim 2, wherein a tilt angle θ3 is formed between the first sidewall and the first substrate, a tilt angle θ4 is formed between the second sidewall and the first substrate, and the tilt angle θ3 and/or the tilt angle θ4 are 60°≤θ3≤90° and 60°≤θ4≤90°.

6. The display panel according to claim 1, wherein the planarization layer further comprises a third region planarization layer located between the first region planarization layer and the second region planarization layer, and separated from the first region planarization layer and the second region planarization layer, and a third sidewall and/or a fourth sidewall are formed on edges of both sides of the third region planarization layer.

7. The display panel according to claim 6, wherein a height of the third sidewall and/or the fourth sidewall is the same as the height of the first sidewall.

8. The display panel according to claim 6, wherein a distance between the first region planarization layer and the third region planarization layer is greater than 10 μm.

9. The display panel according to claim 8, wherein a height difference ΔH is formed between the second sidewall and the second region planarization layer, where 0.5 μm≤ΔH≤1 μm.

10. The display panel according to claim 1, wherein the third region planarization layer has a first sidewall and a second sidewall, a tilt angle θ1 is formed between the first sidewall and the first substrate, a tilt angle θ2 is formed between the second sidewall and the first substrate, and the tilt angle θ1 and/or the tilt angle θ2 are 60°≤θ1≤90° and 60°≤θ2≤90°.

11. The display panel according to claim 1, wherein the third region planarization layer having a width greater than 10 μm.

12. The display panel according to claim 11, wherein a height of the third region planarization layer is between 2.5 μm and 3 μm.

13. A display panel, comprising:
a first substrate including a display region and a peripheral region adjacent to each other;
a plurality of pixel units disposed on the first substrate and located in the display region;

a planarization layer disposed on the first substrate and located in the display region and the peripheral region; and an organic passivation layer disposed on the first substrate, covering the planarization layer and located in the display region and the peripheral region;

wherein the planarization layer further comprises a first region planarization layer located in the display region, and a second region planarization layer located in the peripheral region;

wherein the first region planarization layer has a convex structure adjacent to the peripheral region;

the planarization layer further comprises a third region planarization layer, and a height of the third region planarization layer is the same as the height of the first sidewall.

14. The display panel according to claim 13, wherein the convex structure is located on a lateral side of the first region planarization layer, and the lateral side faces the second region planarization layer.

* * * * *